(12) United States Patent
Kang et al.

(10) Patent No.: US 7,127,134 B2
(45) Date of Patent: Oct. 24, 2006

(54) SEMICONDUCTOR OPTICAL DEVICE

(75) Inventors: Byung-Kwon Kang, Suwon-si (KR); In Kim, Suwon-si (KR); Yu-Dong Bae, Suwon-si (KR); Byeong-Hoon Park, Yongin-si (KR); Sang-Moon Lee, Suwon-si (KR); Young-Hyun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 305 days.

(21) Appl. No.: 10/864,058

(22) Filed: Jun. 9, 2004

(65) Prior Publication Data

US 2005/0129368 A1   Jun. 16, 2005

(30) Foreign Application Priority Data

Dec. 15, 2003   (KR)   .................... 10-2003-0091226

(51) Int. Cl.
*G02B 6/12*   (2006.01)
*G02B 6/10*   (2006.01)
*G02B 6/42*   (2006.01)
*H01S 5/00*   (2006.01)
*H01L 27/15*   (2006.01)

(52) U.S. Cl. .................... 385/14; 385/131; 385/50; 372/50.21; 257/84

(58) Field of Classification Search ................ 385/14, 385/50, 131; 372/50.21; 257/84
See application file for complete search history.

(56) References Cited

U.S. PATENT DOCUMENTS 5,712,864 A * 1/1998 Goldstein et al. ........ 372/50.21

* cited by examiner

*Primary Examiner*—Frank G Font
*Assistant Examiner*—Michael P. Mooney
(74) *Attorney, Agent, or Firm*—Cha & Reiter, L.L.C.

(57) ABSTRACT

A monolithic integrated semiconductor optical element is disclosed. The semiconductor optical element including a substrate, a first waveguide, formed on the substrate, including a first active layer for generating light, and a semi-insulating, grown on the substrate so as to surround a perimeter of the first waveguide layer, including a window area for diffusing the light outputted from the first waveguide and outputting the diffused light. The semiconductor optical elements also includes at least one second waveguide, formed in the window area close to the first waveguide, including a second active layer for detecting a part of the light diffused by the window area.

14 Claims, 5 Drawing Sheets

SEMICONDUCTOR OPTICAL DEVICE

CLAIM OF PRIORITY

This application claims priority to an application entitled "MONOLITHIC INTEGRATED SEMICONDUCTOR OPTICAL DEVICE," filed in the Korean Intellectual Property Office on Dec. 15, 2003 and assigned Serial No. 2003-91226, the contents of which are hereby incorporated by reference.

BACKGROUND OF THE INVENTION

1. Field of the Invention

The present invention relates to a light source for generating an optical signal, and more particularly to a light source including an optical detector for detecting intensity of an optical signal.

2. Description of the Related Art

Optical communication systems and various digital media require low-priced, miniaturized and effective light sources. Semiconductor-type light sources, such as a semiconductor laser, are widely used as general light sources. For example, distributed feedback lasers or Fabry-Perot lasers may be used as the above-mentioned semiconductor laser.

Such semiconductor lasers may be embodied as an integrated type, provided with an electric-absorptive modulator for modulating generated light, on a single substrate. Such integrated type devices are advantageous because it is possible to minimize the semiconductor laser product or system.

However, such semiconductor lasers have a shortcoming because the intensity of light output from the semiconductor laser varies according to the variation in external temperature, driving current and operation time. Accordingly, such conventional light sources must further include a means for continuously monitoring and maintaining the intensity of the output optical signal.

FIG. 1 is a schematic view of a conventional semiconductor optical element. The conventional semiconductor optical element includes a semiconductor light source 120 and an optical detector 110 positioned in the rear of the semiconductor light source 120.

The semiconductor light source 120 employs a reflection-type semiconductor optical amplifier, a distributed feedback laser, and a Fabry-Perot laser, which outputs first and second light signals respectively through both terminals thereof. A non-reflective layer is formed on one terminal of the semiconductor light source 120 for outputting the first light therethrough, and a high-reflective layer is formed on the other terminal of the semiconductor light source 120 for outputting the second light therethrough. The second light signal is a part of the first light signal passing through the high-refection layer.

The optical detector 110 detects the second light signal output from the semiconductor light source 120. In this way, the intensity of the first light signal output from the semiconductor light source 120 is monitored.

FIG. 2 is a schematic view of a conventional semiconductor optical element including a beam splitter. The conventional semiconductor optical element shown in FIG. 3 includes a semiconductor light source 210, an optical detector 220, and a beam splitter 230 for a splitting light signal output from the semiconductor light source 210. A portion of the split light signal is then input to the optical detector 220.

The beam splitter 230 serves to split light signal output from the semiconductor light source 210 and then inputs part of the split light signal to the optical detector 220. The optical detector 220 detects the part of the light output from the beam splitter 230 and monitors the intensity of light output from the semiconductor light source 210.

The intensity of the light output from the rear terminal of the light source is linearly converted from the intensity of the light output from the front terminal of the light source in the above conventional semiconductor optical elements. However, it is difficult to accurately calculate the intensity of the light output from the front terminal of the light source.

In addition, the conventional semiconductor optical element shown in FIG. 1 is restrictedly used only in cases where the ratio of output of the light from the front terminal to the rear terminal of the Fabry-Perot laser, or etc. including a reflection mirror or reflective layer positioned in the rear of the light source is uniform.

Moreover, in the conventional semiconductor optical element shown in FIG. 2, the beam splitter splits light output from the light source, which complicates the structure of the semiconductor optical element and also increases the loss in the intensity of the light.

SUMMARY OF THE INVENTION

One aspect of the present invention relates to a semiconductor optical element that reduces the loss in the intensity of light output from a light source. Another aspect of the present invention relates to a semiconductor optical elements that more accurately monitors the intensity of the light as compared to convention semiconductor optical elements.

One embodiment of the present invention is directed to a monolithic integrated semiconductor optical element including a substrate; a first waveguide, formed on the substrate, including a first active layer for generating light, and a semi-insulating, grown on the substrate so as to surround a perimeter of the first waveguide layer. The first waveguide layer including a window area for diffusing the light outputted from the first waveguide and outputting the diffused light. The element also includes at least one second waveguide, formed in the window area close to the first waveguide, including a second active layer for detecting a part of the light diffused by the window area.

Another embodiment of the present invention is directed to a monolithic integrated semiconductor optical element including a substrate, a first waveguide, formed on the substrate, including a first active layer for generating light, a semi-insulating layer, formed on the substrate, including a window area for diffusing the light output from the first waveguide, and at least one second waveguide including a second active layer for detecting a part of the light diffused by the window area.

In one embodiment, the semi-insulating layer grown on the substrate has a height from the substrate that is approximately the same as those of the first and second waveguides.

In another embodiment, the semi-insulating layer is formed to reduce loss generated by abnormal reflection and diffraction of light traveling in the first and second waveguides.

In yet another embodiment, the second waveguide is symmetrical centering on the window area.

BRIEF DESCRIPTION OF THE DRAWINGS

The above features and other advantages of the present invention will be more clearly understood from the following detailed description taken in conjunction with the accompanying drawings, in which.

DETAILED DESCRIPTION

Figure 1:
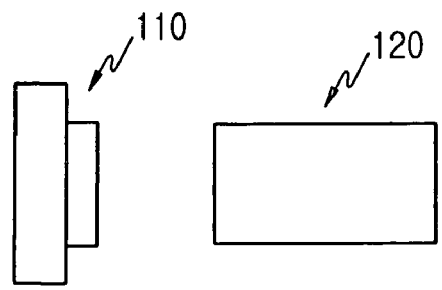
FIG. 1 is a schematic view of a conventional semiconductor optical element including an optical detector positioned in the rear of a light source.
Figure 2:
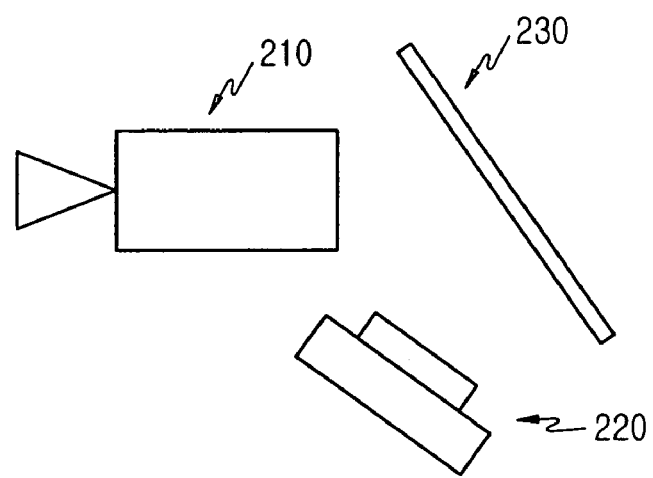
FIG. 2 is a schematic view of a conventional semiconductor optical element including a beam splitter.

Now, embodiments of the present invention will be described in detail with reference to the annexed drawings. In the drawings, the same or similar elements are denoted by the same reference numerals even though they are depicted in different drawings. For the purposes of clarity and simplicity, a detailed description of known functions and configurations incorporated herein will be omitted as it may obscure the subject matter of the present invention unclear.

Figure 3:
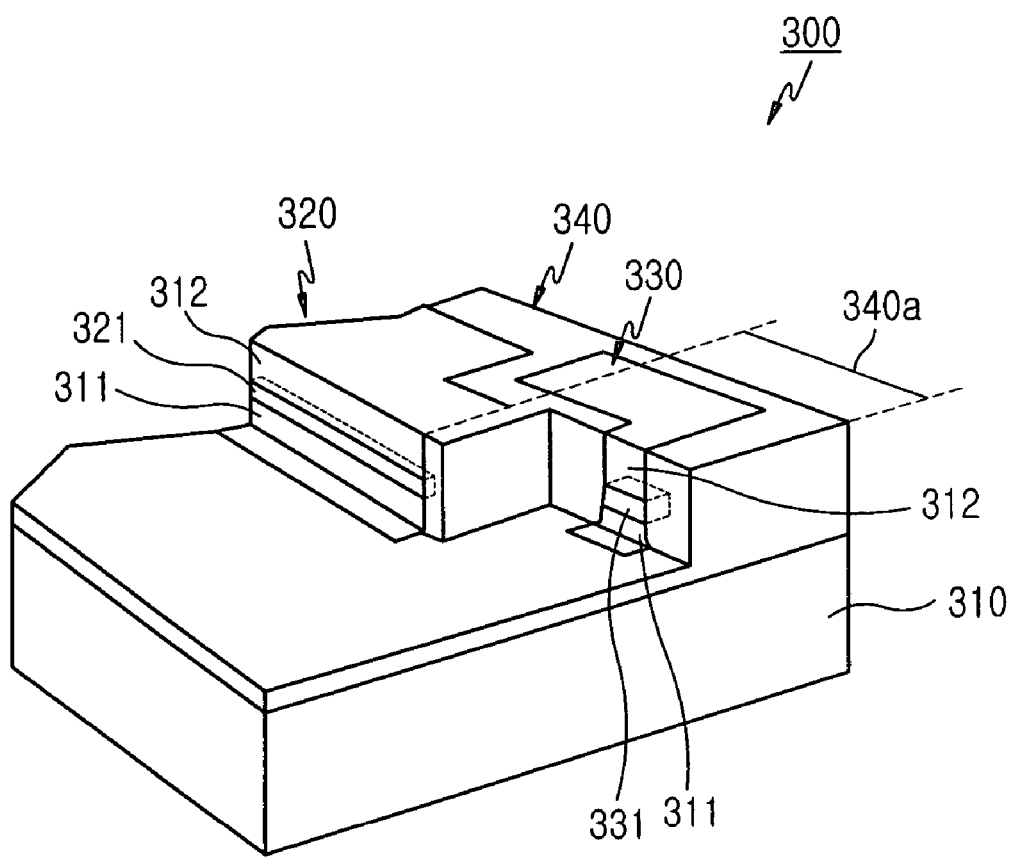
FIG. 3 is a perspective view of a monolithic integrated semiconductor optical element in accordance with a first embodiment of the present invention.
Figure 4:
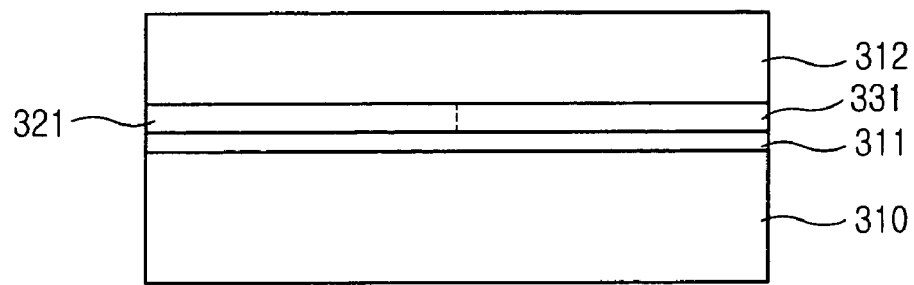
FIG. 4 is a cross-sectional view illustrating a growth process of first and second optical waveguides of the semiconductor optical element shown in FIG. 3.

FIG. 3 is a perspective view of a monolithic integrated semiconductor optical element 300 in accordance with a first embodiment of the present invention. FIG. 4 is a cross-sectional view illustrating a growth process of first and second optical waveguides of the semiconductor optical element shown in FIG. 3. With reference to FIGS. 3 and 4, the semiconductor optical element 300 includes a substrate 310, a first waveguide 320 formed on the substrate 310, a semi-insulating layer 340 grown on the substrate 310 so as to surround the perimeter of the first waveguide 320, and at least one second waveguide 330 having a second active layer 331.

The semiconductor optical element 300 may be manufactured by forming the first and second waveguides 320 and 330 having a MESA structure respectively including active layers 321 and 331 having different band gaps and then by growing the semi-insulating layer 340 on the substrate 310 so as to surround the perimeters of the first and second waveguides 320 and 330.

Each of the first and second waveguides 320 and 330 includes a lower clad layer 311 formed on the substrate 310, a plurality of active layers 331 or 321 having different band gaps formed on the lower clad layer 311, and an upper clad layer 312 formed on the active layers 331 or 321.

The lower clad layer 311 includes a buffer layer (not shown) on the substrate 310 and an n-InP layer (not shown) formed on the buffer layer. The active layers 331 and 321 having different band gaps may be grown on the lower clad layer 311 by a selected area growth method or a butt joint growth method.

The upper clad layer 312 includes a p-InP layer (not shown) formed on the active layers 331 and 321, and a contact layer (not shown) formed on the p-InP layer.

The semiconductor optical element 300 further includes a plurality of electrode means (not shown) formed on the upper clad layer 312 and insulated from each other for operating the active layers 331 and 321, and a common electrode (not shown) formed on the lower surface of the substrate 310 for applying driving current to the active layers 331 and 321.

The first waveguide 320 formed on the substrate 310 includes the first active layer 321 for generating light. In one aspect, the first waveguide 320 forms a semiconductor light source such as a distributed feedback laser provided with a grid on the lower clad layer 311 or a reflection-type semiconductor optical amplifier.

Since the first waveguide 320 has the first active layer 321 having different band gaps, a part of the first waveguide 320 is embodied as the above-described light source and the residual part of the first waveguide 320 is embodied as an electro-absorptive modulator-type semiconductor optical element integrated with an electro-absorptive modulator.

The first active layer 321 is designated such that the energy band gap of a part of the first active layer 321 is higher than those of residual parts of the first active layer 321. Thus, the part of the first layer 321 having the higher energy band gap serves as the above electro-absorptive modulator, and the parts of the first layer 321 having lower energy band gaps serve as a light source, i.e., a semiconductor optical element integrated on a single substrate.

The first waveguide 320 and the second waveguides 330 may be grown on the substrate 310, and then are etched at desired areas to have a MESA structure.

The semi-insulating layer 340 includes a window area 340a for diffusing the light output from the first waveguide 320 and then outputting the diffused light. The semi-insulating layer 340 is grown on the substrate 310 to surround the perimeters of the first and second waveguides 320 and 330. The semi-insulating layer 340 may be made of InP, for example. The window area 340a diffuses the light output from one terminal of the first waveguide 320, which reduces or prevents the light output from the first waveguide 320 from again traveling toward the first waveguide 320.

The semi-insulating layers 340 grown on the substrate 310 may have a height from the substrate 310 the same as those of the first and second waveguides 320 and 330. Such a configuration reduces or prevents loss generated by abnormal reflection and diffraction of light traveling in the first and second waveguides 320 and 330.

The second waveguide 330 is grown in the window area 340a so that a part of light diffused in the window area 340a is detected by the second waveguide 330, and includes the second active layer 331. The second waveguide 330 may be a photo diode having a waveguide shape. The second waveguide serves to monitor the intensity of the light output from the first waveguide 320.

Figure 5:
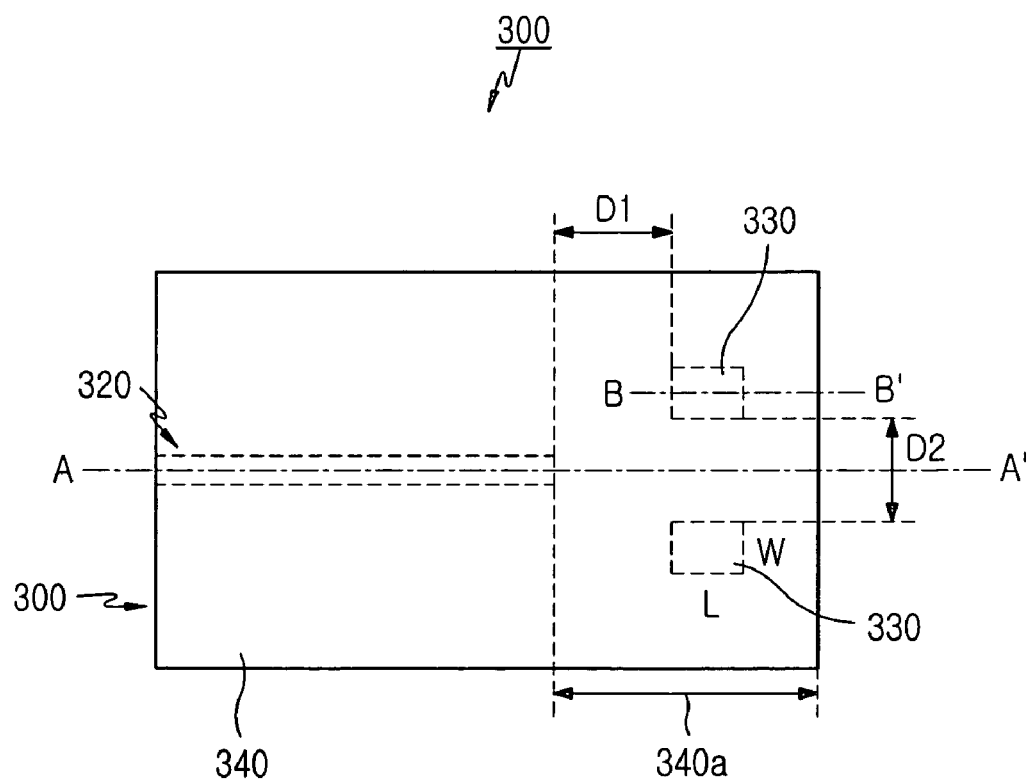
FIG. 5 is a plan view of the semiconductor optical element shown in FIG. 3.

FIG. 5 is a plan view of the semiconductor optical element shown in FIG. 3. In this example, the second waveguide 330 is positioned symmetrically centering on the far-field of the light so that the second waveguide 330 is symmetrical centering on a route of the light traveling through the window area 340a, thereby improving coupling efficiency of the light.

Figure 6:
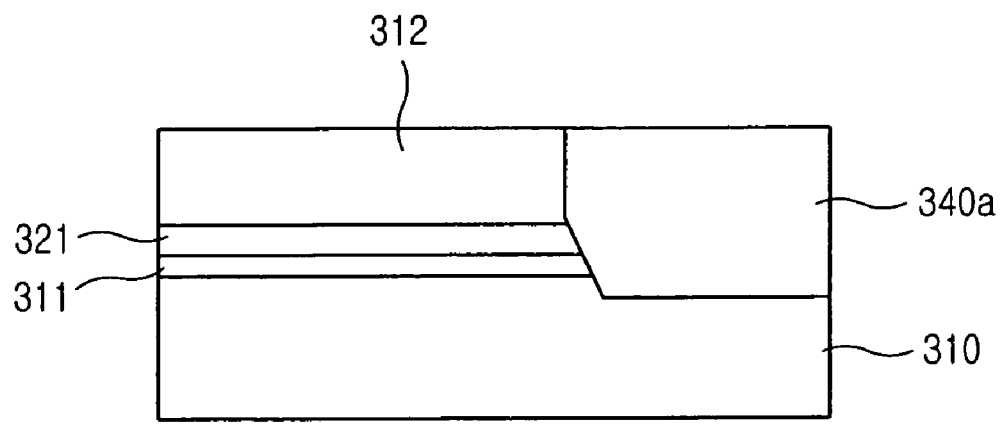
FIG. 6 is a cross-sectional view of the semiconductor optical element taken along the line A–A' of FIG. 5.

FIG. 6 is a cross-sectional view of the semiconductor optical element taken along the line A–A' of FIG. 5. In this example, the window area 340a is formed on the substrate 310 such that the window area 340a contacts one terminal of the first waveguide 320, thereby outputting the light output from the first waveguide 320 to the outside of the semiconductor optical element 300.

The second waveguide 330 is separated from the first waveguide 320 by a predetermined distance ($D_1$), and is separated from the light traveling through the window area 340a by a predetermined distance ($D_2$), thereby monitoring the intensity of the light diffused in the window area 340a.

Figure 7:
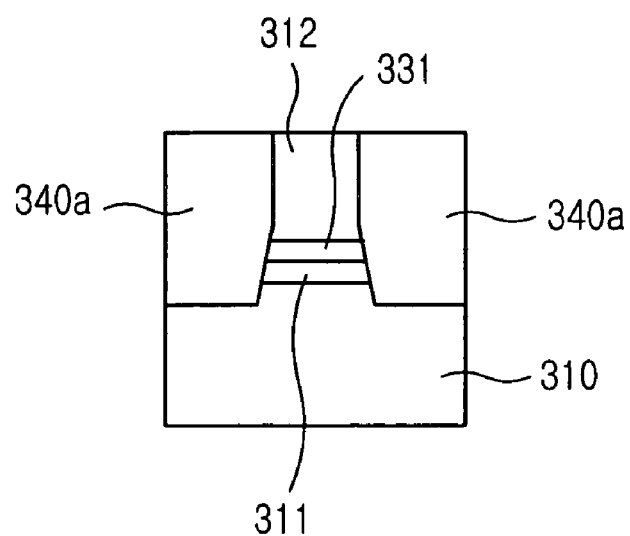
FIG. 7 is a cross-sectional view of the semiconductor optical element taken along the line B–B' of FIG. 5.

FIG. 7 is a cross-sectional view of the semiconductor optical element taken along the line B–B' of FIG. 5. The second waveguide 330 is positioned in the window area 340a and absorbs a part of the light diffused in the window area 340a, thereby detecting the light output from the first waveguide 320 at a reduced or minimum loss.

Figure 8:
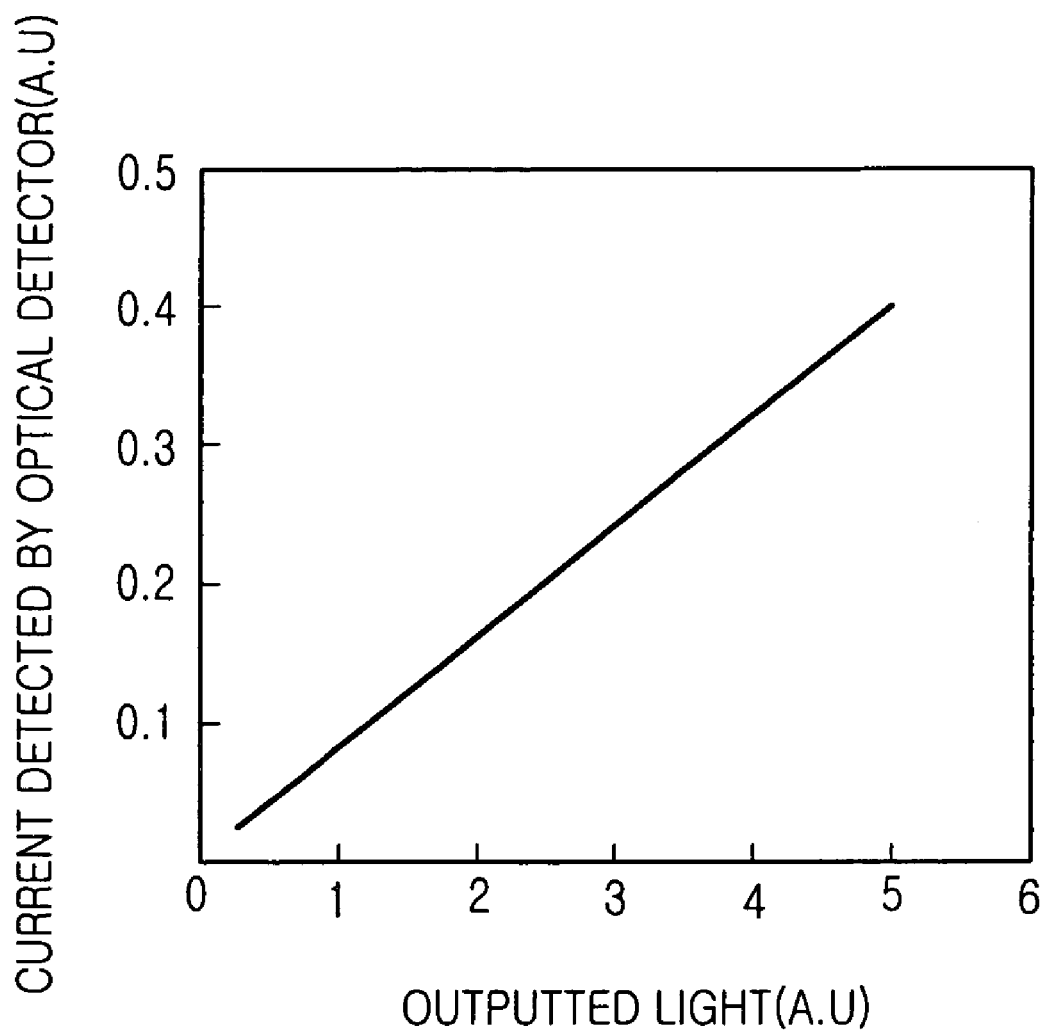
FIG. 8 is a graph illustrating the relationship between light absorbed by a second waveguide shown in FIG. 3 and light not absorbed by the second waveguide and outputted from a window area.

FIG. 8 is a graph illustrating the relationship between light absorbed by the second waveguide shown in FIG. 3 and light not absorbed by the second waveguide and output from the window area. The detected level of light is small in respect to the output light. Thus the detected light does not influence (i.e., reduce) the output of the light. Since the coupling efficiency of the optical detector is typically less than 5%, it is noted that more than 95% of the input light is output. The coupling efficiency of the optical detector is controlled by adjusting the position of the second waveguide, thereby reducing or minimizing the loss of the output light.

As apparent from the above description, one embodiment of the present invention provides a semiconductor optical element, in which an optical detector is positioned in a window area of a semi-insulating layer formed in front of a light source so that the optical detector detects a part of diffused light having traveled through the window area, thereby minimizing the loss of the intensity of the light output from the semiconductor optical element, and stably monitoring the intensity of the light.

Further, in another embodiment, the semiconductor optical element of the present invention integrates the optical detector and the light source on a single substrate, thus being easily manufactured and providing a miniaturized product.

Although only the above embodiments of the present invention have been described in detail, those skilled in the art will appreciate that various modifications, additions, and substitutions to the specific elements are possible, without departing from the scope and spirit of the invention as disclosed in the accompanying claims.

What is claimed is:

1. A semiconductor optical element comprising:
   a substrate;
   a first waveguide, formed on the substrate, including a first active layer for generating light;
   a semi-insulating layer, grown on the substrate so as to surround a perimeter of the first waveguide layer, including a window area for diffusing the light output from the first waveguide; and
   at least one second waveguide including a second active layer for detecting a part of the light diffused by the window area.

2. The semiconductor optical element as set forth in claim 1, wherein the semiconductor optical element is an monolithic integrated semiconductor optical element.

3. The semiconductor optical element as set forth in claim 1, wherein the at least one second waveguide is formed in the window area.

4. The semiconductor optical element as set forth in claim 1, wherein each of the first and second waveguides includes:
   a lower clad layer formed between the substrate and the corresponding one of the first and second active layers; and
   an upper clad layer formed on the corresponding one of the first and second active layers.

5. The semiconductor optical element as set forth in claim 1, wherein the semi-insulating layer grown on the substrate has a height from the substrate that is approximately the same as those of the first and second waveguides.

6. The semiconductor optical element as set forth in claim 2, wherein the semi-insulating layer is formed to reduce loss generated by abnormal reflection and diffraction of light traveling in the first and second waveguides.

7. The semiconductor optical element as set forth in claim 1, wherein the at least one second waveguide is symmetrical centering on the window area.

8. The semiconductor optical element as set forth in claim 1, wherein each of the first and second active layers includes a plurality of areas having different band gaps by a selected area growth method.

9. The semiconductor optical element as set forth in claim 1, wherein the first and second active layers have different band gaps by a selected area growth method.

10. The monolithic integrated semiconductor optical element as set forth in claim 1, wherein the first and second active layers have different band gaps by a butt joint growth method.

11. A monolithic integrated semiconductor optical element comprising:
    a substrate;
    a first waveguide, formed on the substrate, including a first active layer for generating light;
    a semi-insulating layer, formed on the substrate, including a window area for diffusing the light output from the first waveguide; and
    at least one second waveguide including a second active layer for detecting a part of the light diffused by the window area.

12. The monolithic integrated semiconductor optical element as set forth in claim 11, wherein the semi-insulating layer grown on the substrate has a height from the substrate that is approximately the same as those of the first and second waveguides.

13. The monolithic integrated semiconductor optical element as set forth in claim 11, wherein the semi-insulating layer is formed to reduce loss generated by abnormal reflection and diffraction of light traveling in the first and second waveguides.

14. The monolithic integrated semiconductor optical element as set forth in claim 11, wherein the at least one second waveguide is symmetrical centering on the window area.

* * * * *